United States Patent
Drost et al.

(10) Patent No.: US 6,472,931 B1
(45) Date of Patent: Oct. 29, 2002

(54) METHOD AND APPARATUS THAT MODELS NEURAL TRANSMISSION TO AMPLIFY A CAPACITIVELY-COUPLED INPUT SIGNAL

(75) Inventors: Robert J. Drost, Mountain View, CA (US); Sharon Sookdeo-Drost, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/991,475

(22) Filed: Nov. 16, 2001

(51) Int. Cl.[7] .............................. G06G 7/12; H03K 3/00

(52) U.S. Cl. ....................................... 327/560; 327/112

(58) Field of Search ................................. 327/560–563, 327/51, 108, 112, 77, 87, 89, 334, 170; 326/86, 87

(56) References Cited

U.S. PATENT DOCUMENTS

| | | | | |
|---|---|---|---|---|
| 4,733,961 A | * | 3/1988 | Mooney ...................... 250/342 |
| 6,060,940 A | * | 5/2000 | Chiozzi ....................... 327/562 |
| 6,120,461 A | * | 9/2000 | Smyth ......................... 351/209 |
| 6,184,721 B1 | * | 2/2001 | Krymski ..................... 327/563 |
| 6,392,296 B1 | * | 5/2002 | Ahn et al. ................... 257/698 |

OTHER PUBLICATIONS

Publication entitled "The Axon: An Active,Lossless, Noiseless Transmission Line," Waves and Transmission Lines, Sec. 10–20, Kraus, Electromagnetics, 3rd Edition, McGraw Hill, 1984.

* cited by examiner

*Primary Examiner*—Toan Tran
(74) *Attorney, Agent, or Firm*—Park, Vaughan & Fleming LLP

(57) ABSTRACT

One embodiment of the present invention provides a system for amplifying an input signal received from a capacitive sensor. The system includes an input for receiving an input signal from the capacitive sensor and an amplifier that amplifies the input signal to produce an output signal. This amplifier includes a pull-up circuit that pulls the output signal up to a high voltage when the input signal exceeds a threshold voltage. It also includes a pull-down circuit that pulls the output signal down to a low voltage when the input signal falls below the threshold voltage. After the output signal is pulled up to the high voltage, the pull-up circuit enters a refractory state in which the pull-up circuit uses a limited current, and the pull-down circuit enters a receptive state in which the pull-down circuit is sensitized to react to small changes in the input signal. After the output signal is pulled down to the low voltage, the pull-down circuit enters a refractory state in which the pull-down circuit uses a limited current, and the pull-up circuit enters a receptive state in which the pull-up circuit is sensitized to react to small changes in the input signal.

22 Claims, 5 Drawing Sheets

METHOD AND APPARATUS THAT MODELS NEURAL TRANSMISSION TO AMPLIFY A CAPACITIVELY-COUPLED INPUT SIGNAL

BACKGROUND

1. Field of the Invention

The present invention relates to mechanisms for communicating information between semiconductor chips. More specifically, the present invention relates to a method and an apparatus for receiving and amplifying an input signal received from a capacitive sensor.

2. Related Art

Advances in semiconductor technology presently make it possible to integrate large-scale systems, including tens of millions of transistors, onto a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, integrating a large-scale system onto a single semiconductor chip greatly increases the data transfer rates required to communicate between semiconductor chips. Data is presently moved onto and off of a semiconductor chip through I/O pads located on the boundary of the semiconductor chip. Pin-grid array packaging technologies have increased the number of I/O pads available for this purpose. However, this increase has not kept pace with the exponential increase in the amount of circuitry that can be integrated onto a semiconductor chip.

Hence, as integration densities continue to increase, each I/O pin must satisfy I/O requirements for progressively larger amounts of on-chip circuitry. Furthermore, increasing integration densities allow higher clock on-chip speeds, and higher on-chip clock speeds mean that more clock cycles are required to move data from the interior of a semiconductor chip to the I/O pins on the border of the semiconductor chip.

Some researchers have begun to explore the possibility of using capacitive transmitters located on a first semiconductor chip to transmit signals to corresponding capacitive receivers located on the surface of a second semiconductor chip. This allows data to be transferred from directly from locations within the interior of the first semiconductor chip to locations within the interior of the second semiconductor chip without passing through I/O pins located on the chip boundaries. It also makes it possible to provide many more communication pathways between semiconductor chips because the signals do not have to be routed through a limited number of I/O pins.

However, the electrical signals received through a capacitive sensor are very weak, and must be greatly amplified in order to be used by circuitry within the semiconductor chip. This amplification process consumes a great amount of power because the amplification transistors must be kept very near their threshold levels in order to detect minute variations and input voltage. This power consumption is further multiplied if there exist large numbers of capacitive sensors.

Hence what is needed is a method and an apparatus for amplifying an input signal received from a capacitive sensor without consuming a large amount of power.

SUMMARY

One embodiment of the present invention provides a system for amplifying an input signal received from a capacitive sensor. The system includes an input for receiving an input signal from the capacitive sensor and an amplifier that amplifies the input signal to produce an output signal. This amplifier includes a pull-up circuit that pulls the output signal up to a high voltage when the input signal exceeds a threshold voltage. It also includes a pull-down circuit that pulls the output signal down to a low voltage when the input signal falls below the threshold voltage. After the output signal is pulled up to the high voltage, the pull-up circuit enters a refractory state in which the pull-up circuit uses a limited current, and the pull-down circuit enters a receptive state in which the pull-down circuit is sensitized to react to small changes in the input signal. After the output signal is pulled down to the low voltage, the pull-down circuit enters a refractory state in which the pull-down circuit uses a limited current, and the pull-up circuit enters a receptive state in which the pull-up circuit is sensitized to react to small changes in the input signal.

In one embodiment of the present invention, the system includes an output delay chain that produces feedback from the output signal. After the output signal is pulled up to the high voltage, this feedback causes the pull-up circuit to enter the refractory state and causes the pull-down circuit to enter the receptive state. After the output signal is pulled down to the low voltage, this feedback causes the pull-down circuit to enter the refractory state and causes the pull-up circuit to enter the receptive state.

In one embodiment of the present invention, the system includes a bi-stable circuit. This bi-stable circuit is configured to hold the output to the high voltage until the input signal falls below the threshold voltage. It is also configured to hold the output to the low voltage until the input signal rises above the threshold voltage.

In one embodiment of the present invention, the system includes a pull-up current mirror with the pull-up circuit that is configured to limit the current used by the pull-up circuit while in the refractory state.

In one embodiment of the present invention, the system includes a pull-down current mirror with the pull-down circuit that is configured to limit the current used by the pull-down circuit while in the refractory state.

In one embodiment of the present invention, when the pull-down circuit is in the receptive state and the input voltage drops below the threshold voltage, the pull-down circuit is configured to enter an active state in which the pull-down circuit draws sufficient current to rapidly switch the output signal to the low voltage.

In one embodiment of the present invention, when the pull-up circuit is in the receptive state and the input voltage rises above the threshold voltage, the pull-up circuit is configured to enter an active state in which the pull-up circuit draws sufficient current to rapidly switch the output signal to the high voltage.

In one embodiment of the present invention, the system includes a high resting voltage circuit that is configured to generate a high resting voltage for the input when the pull-up circuit is in the refractory state.

In one embodiment of the present invention, the system includes a low resting voltage circuit that is configured to generate a low resting voltage for the input when the pull-down circuit is in the refractory state.

In one embodiment of the present invention, the capacitive sensor is an I/O pad on a surface of a semiconductor chip.

Table 1 is a partial state table for pull-up and pull-down pores in accordance with an embodiment of the present invention.

Figure 3:
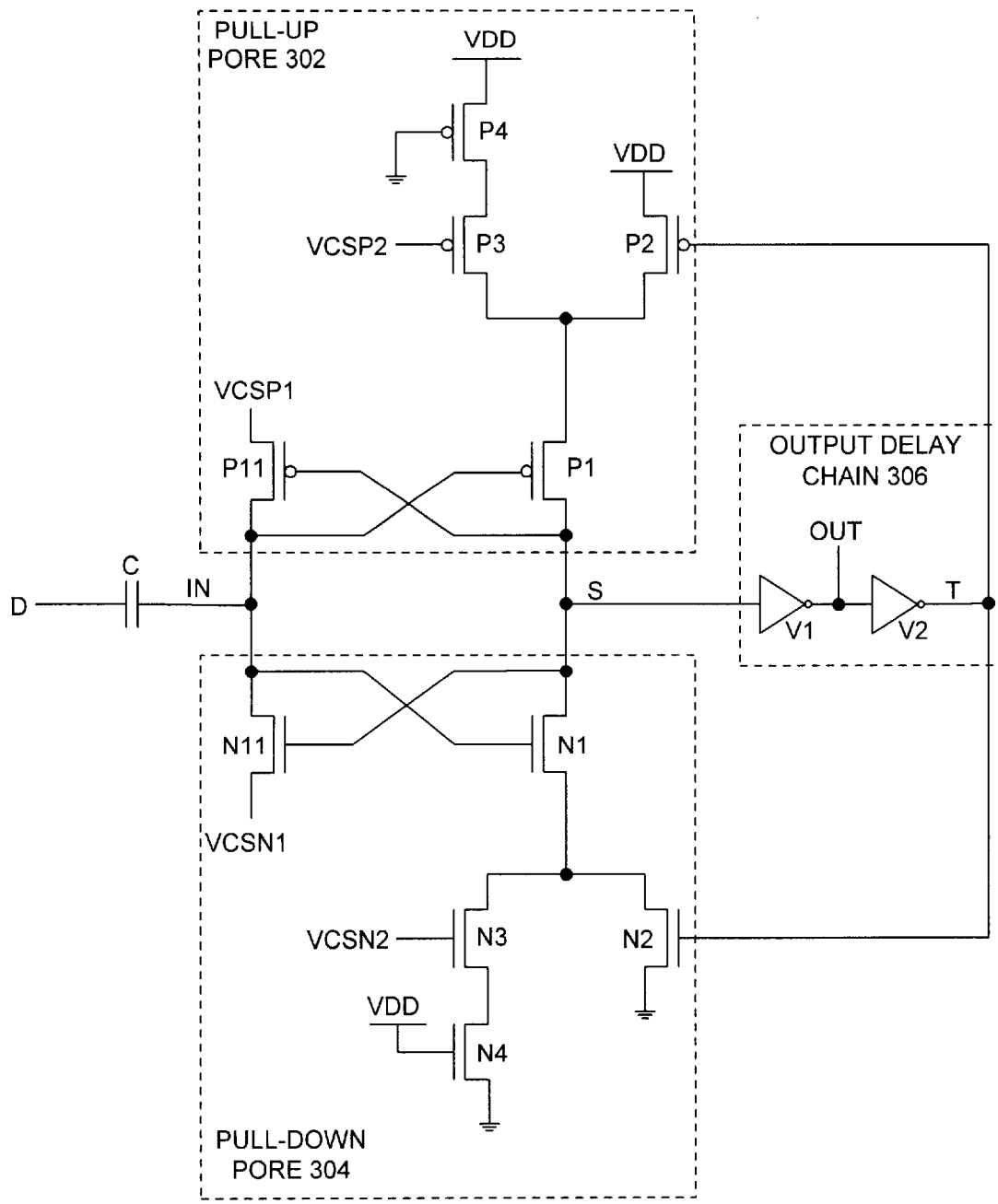
FIG. 3 is a schematic diagram of an input buffer that amplifies a capacitive input signal in accordance with an embodiment of the present invention.
Figure 4A:
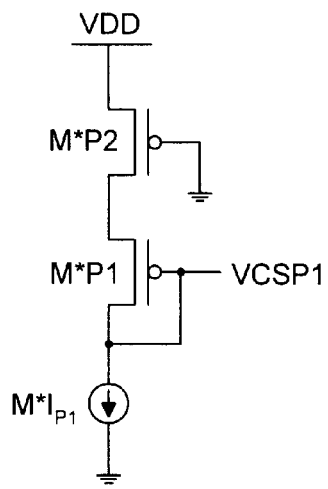
FIG. 4A illustrates circuitry that generates a resting potential for the circuitry illustrated in FIG. 3 in accordance with an embodiment of the present invention.
Figure 4B:
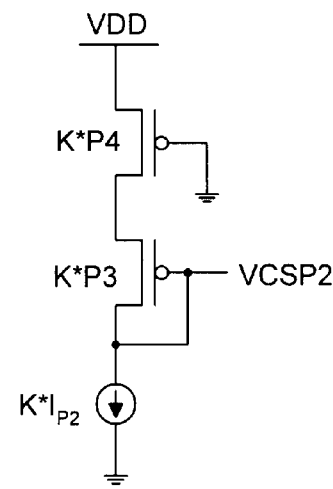
FIG. 4B illustrates circuitry that that acts as part of a current mirror for the circuitry illustrated in FIG. 3 in accordance with an embodiment of the present invention.
Figure 4C:
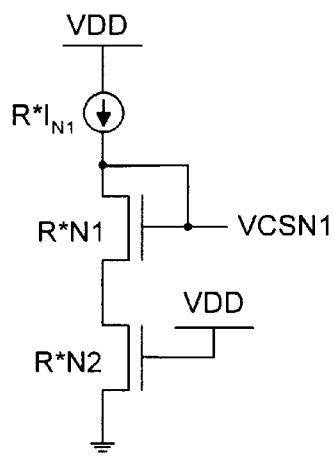
FIG. 4C illustrates circuitry that generates a resting potential for the circuitry illustrated in FIG. 3 in accordance with an embodiment of the present invention.
Figure 4D:
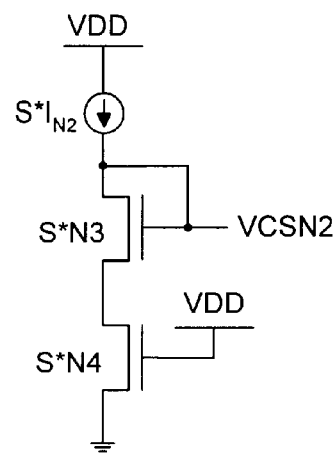
FIG. 4D illustrates circuitry that that acts as part of a current mirror for the circuitry illustrated in FIG. 3 in accordance with an embodiment of the present invention.

Table 2 illustrates the operation of the circuitry illustrated in FIG. 3 in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Capacitive Sensors

Figure 1A:
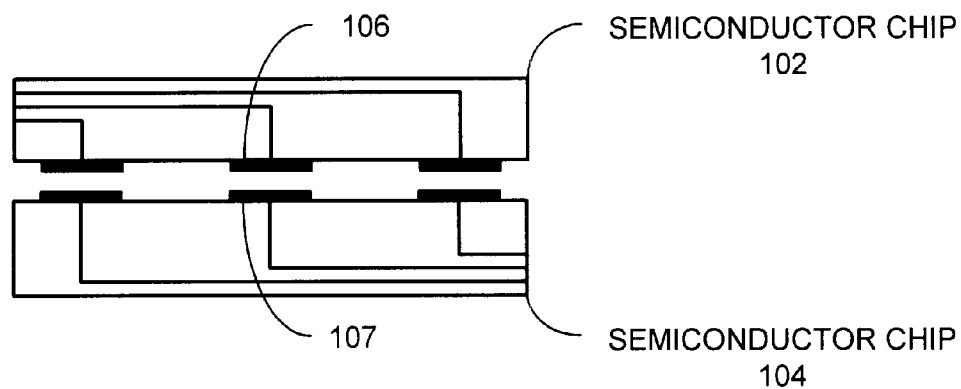
FIG. 1A illustrates how capacitive sensors are used to communicate between semiconductor chips in accordance with an embodiment of the present invention.

FIG. 1A illustrates how capacitive sensors are used to communicate between semiconductor chips 102 and 104 in accordance with an embodiment of the present invention. In FIG. 1A, semiconductor chip 102 includes a number of capacitive transmitter plates, including capacitive transmitter plate 106, located on its lower surface. Semiconductor chips 102 is aligned over semiconductor chip 104, which includes a number of corresponding capacitive receiver plates, including capacitive receiver plate 107. Note that there exists either an air gap or a small layer of dielectric material between corresponding capacitive transmitter and capacitive receiver plates.

Also note that semiconductor chips 102 and 104 can generally include any type of semiconductor chips. For example, semiconductor chip 102 may contain a microprocessor, while semiconductor chip 104 contains random access memory to be used by the microprocessor. In another example, semiconductor chip 102 contains a microprocessor and semiconductor chip 104 includes a graphics coprocessor.

Figure 1B:
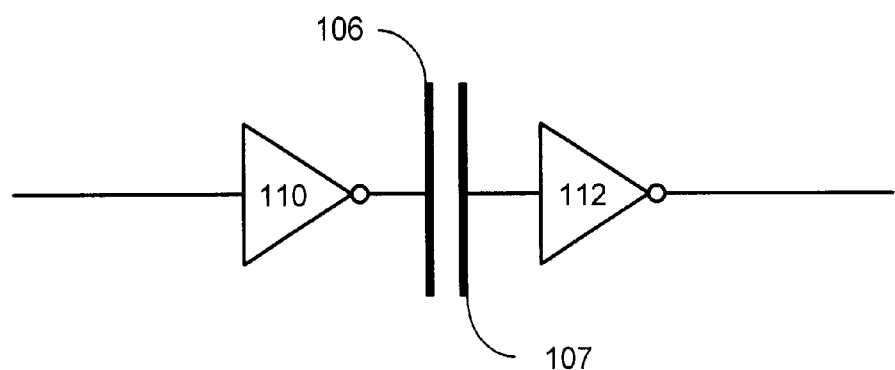
FIG. 1B illustrates circuitry that is used to drive signals to and from a capacitive interface in accordance with an embodiment of the present invention.

FIG. 1B illustrates circuitry that is used to drive signals to and from a capacitive interface in accordance with an embodiment of the present invention. In FIG. 1B, output 110 drives a signal onto capacitive transmitter plate 106. This causes a small voltage change on capacitive receiver plate 107. This voltage change is amplified by input buffer 112 to produce an amplified signal that can be used by circuitry within semiconductor chip 104.

Layout

Figure 2A:
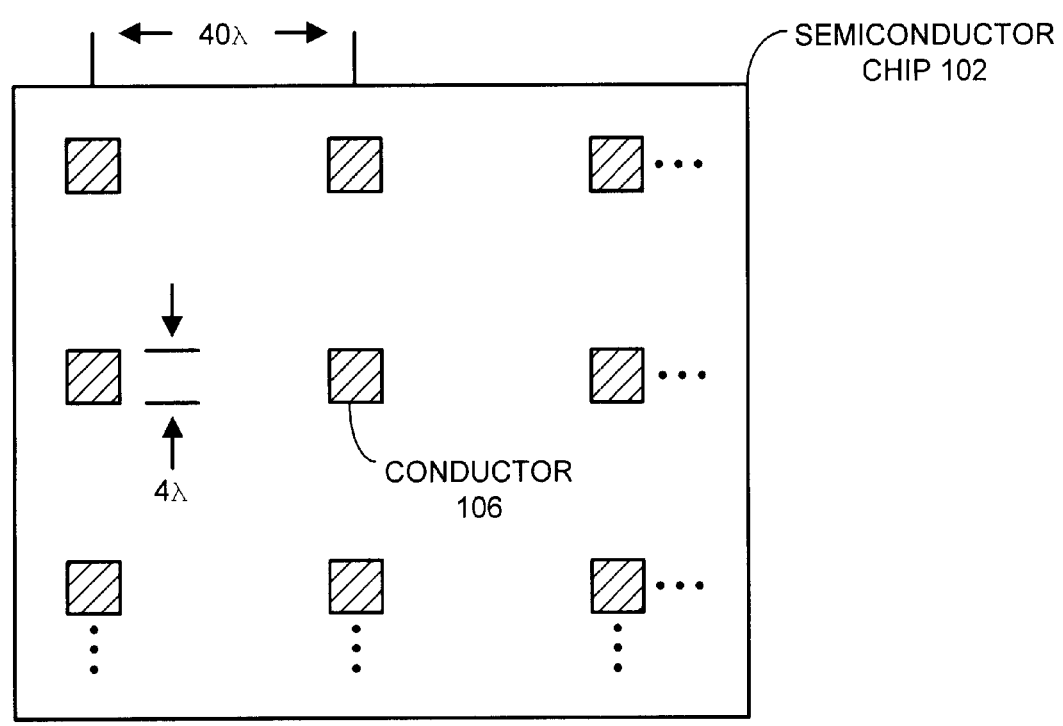
FIG. 2A illustrates a layout of capacitive transmitters on a semiconductor chip in accordance with an embodiment of the present invention.

FIG. 2A illustrates the layout of capacitive transmitters on a semiconductor chip in accordance with an embodiment of the present invention. In this embodiment, a number of capacitive transmitter plates are arranged in a grid pattern on the surface of semiconductor chip 102. These capacitive transmitter plates have an exemplary size of $4\lambda$ by $4\lambda$ and an exemplary spacing of $40\lambda$ by $4\lambda$.

Figure 2B:
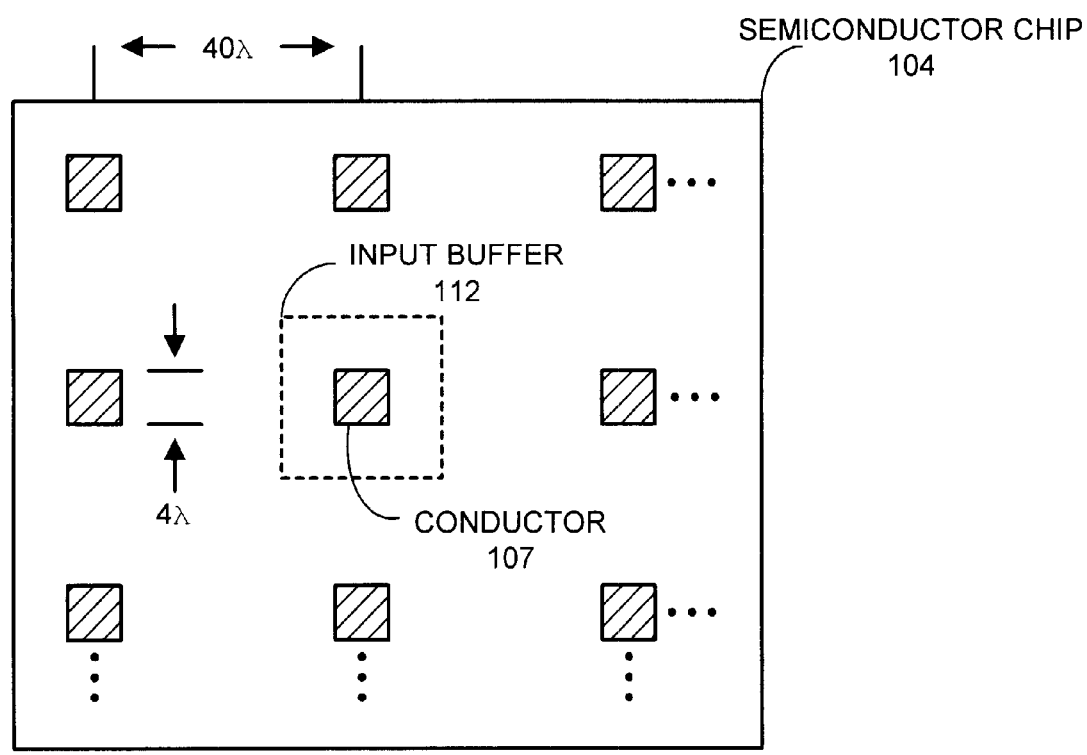
FIG. 2B illustrates a layout of capacitive receivers on a semiconductor chip in accordance with an embodiment of the present invention.

FIG. 2B illustrates the layout of capacitive receivers on a semiconductor chip in accordance with an embodiment of the present invention. In this embodiment, the capacitive receiver plates are arranged in a grid pattern on the surface of semiconductor chip 104. They also have exemplary size of $4\lambda$ by $4\lambda$ and an exemplary spacing of $40\lambda$ by $40\lambda$. Furthermore, each capacitive receiver plate, such as capacitive receiver plate 107, is surrounded by circuitry to implement an input buffer 112. This circuitry is described in more detail below with reference to FIG. 3.

Input Buffer

FIG. 3 is a schematic diagram of an input buffer 112 that amplifies a capacitive input signal in accordance with an embodiment of the present invention. Note that the circuit illustrated in FIG. 3 includes a number features seen in neurons and axons. First is a refractory period, during which a portion of the circuit is prevented from reacting to input changes. Second, it uses small charge pump currents to create resting potentials while waiting for the next input transition. These small charge pump currents dissipate little power. Third, it uses a receptive period, during which a portion of the circuit is sensitized to react to small input changes. The sensitization during the receptive period allows the circuit to transition quickly for the small input voltages expected for a capacitively-coupled input. This sensitization prevents the small charge pump currents from slowing the transition speed.

The circuit illustrated in FIG. 3 is divided into a pull-up pore (circuit) 302, a pull-down pore (circuit) 304, and an output delay chain 306.

When the input node "In" is high, the circuit is in the high state. In the high state, the circuit waits for a falling input transition on the input node "In", the pull-down pore 304 is refractive and the pull-up pore 302 is receptive. A falling input transition activates pull-up pore 302. Pull-up pore 302 drives an internal "S" node high and through positive feedback drives the In node low. Later, the output delay chain 306 sets pull-up pore 302 to be refractory, and pull-down pore 304 to be receptive. This leaves the input buffer in the low state, waiting for the next rising transition.

When the input node "In" is low, the circuit is in the low state. In the low state, the circuit waits for a rising input transition on the "In" node, the pull-up pore 302 is refractive and the pull-down pore 304 is receptive. A rising input transition activates pull-down pore 304. Pull-down pore 304 drives internal "S" node low and through positive feedback drives the In node high. Later, output delay chain 306 sets pull-down pore 304 to be refractory, and pull-up pore 302 to be receptive. This leaves the input buffer in the high state, waiting for the next falling transition.

The high and low resting potentials for the "In" node are set to cause pull-up pore 302 and pull-down pore 304 to output currents of $I_{P1}$ and $I_{N1}$ respectively, during their receptive periods. When refractory, pull-up pore 302 and pull-down pore 304 source and sink currents of $I_{P2}$ and $I_{N2}$, respectively. The ratio of $I_{P1}$ to $I_{N2}$ and the ratio of $I_{N1}$ to $I_{P2}$ determine the input sensitivity. When the In node transitions due to a capacitively-coupled input, the receptive current increases, whereas the refractory current holds constant. Together, the refractory and receptive currents can be decreased to lower power consumption.

Referring to FIG. 3, pull-up pore 302 includes transistors P1 to P11, pull-down pore 304 includes transistors N1 to N11, and output delay chain 306 includes inverters V1 and V2. Note that synapse capacitor, C, does not have to be a part of the circuit.

The input buffer illustrated in FIG. 3 can be used in an application where the output node D from the proceeding driver circuit is capacitively coupled by a capacitance C to the input node In.

During falling transitions, pull-up pore 302 pulls up node S, whereas during rising transitions, pull-down pore 304 pulls down node S. Note that they are referred to as "pores" because they have a receptive state during which a depolarizing transition on the In node causes the pore to rapidly "open," pushing or pulling a large current onto or off of node S.

Vcsp1 and Vcsn1 are the high and low resting voltages for the input node, In. Vcsp1 is chosen to make transistors P1 and P2 act as a current source, sourcing $I_{P1}$, when signal T is low. Vcsn1 is chosen to make transistors N1 and N2 act as a current sink, sinking $I_{N1}$, when signal T is high.

Table 1 shows four of the state combinations for the pull-up pore 302 and pull-down pore 304. Pores 302 and 304 individually can be in the refractory, receptive, or activated states. In the refractory state pores 302 and 304 output a current of $I_{N2}$ or $I_{P2}$ that holds node S low or high (~Gnd or ~Vdd), respectively. In the receptive state pores 302 and 304 output a small current onto the S node ($I_{N1}$ or $I_{P1}$). The refractory currents are set to be larger than the receptive currents.

The +/−ΔV refers to the capacitively-coupled input voltage. Depending on the transition amplitude on node D, and the ratio of capacitance C to the parasitic capacitance on node In, ΔV will have different amplitudes. When ΔV sufficiently depolarizes the In node, the receptive pore activates and causes the input buffer to flip state.

The circuit achieves low power because the receptive ($I_{N1}$ and $I_{P1}$) and refractory currents ($I_{N2}$ and $I_{P2}$) can be set as low as desired. The ΔV amplitude that exceeds the depolarizing threshold and causes a transition is set by the ratio of the receptive to refractory current. The refractory current needs to be larger in order maintain positive feedback and thus hold the resting state. Increasing the ratio of refractory to receptive currents increases the depolarizing threshold, but decreases transition speed.

The circuit illustrated in FIG. 3 achieves high speed because when the In node depolarizes, one pore is activated, whereas the refractory pore remains refractory. The activated pore outputs a very large current. However, the pore in the refractory state outputs only the small $I_{N2}$ or $I_{P2}$ current. Thus, node S transitions similarly in speed to a domino logic node because there is only a constant opposing current during a transition.

Table 2 explains the operation of the circuit over a full cycle, resulting in two transitions of the output node. The sequence of events that occur during a transition are broken up into a series of steps presented over a number of Table rows.

The State column describes the overall state of the circuit. The circuit can be stable in either a high or low state, or can be transitioning between high and low. Table 2 steps through the events that occur during a transition. The columns for nodes D, In, S, Out, and T show the voltages on the nodes, whereas the columns for the transistors (N1 to N11 and P1 to P11) and inverters (V1 and V2) list the driving states of

TABLE 1

| Node voltages | | | Pull-down pore (Block N) | | Pull-up pore (Block P) | |
|---|---|---|---|---|---|---|
| | | | Current sunk | | Current sourced | |
| In | S | T | from S node | State | onto S node | State |
| Vcsn1 | ~Vdd | Vdd | $I_{N1}$ | receptive | $I_{P2}$ | refractory |
| Vscn1 + ΔV | ~Vdd | Vdd | large current | activated | $I_{P2}$ | refractory |
| Vcsp1 | ~Gnd | Gnd | $I_{N2}$ | refractory | $I_{P1}$ | receptive |
| Vcsp1 − ΔV | ~Gnd | Gnd | $I_{N2}$ | refractory | large current | activated |

Vcsp2 is a voltage that makes transistors P3 and P4 source a current $I_{P2}$. Vcsn2 is a voltage that makes transistors N3 and N4 sink a current $I_{N2}$.

the transistors and inverters. Empty table cells indicate that the voltage or driving state is the same as the first non-empty cell above it in the table.

TABLE 2

| State | D | In | S | Out | T | N11 | P11 | N1 | N2 | N3, N4 | P1 | P2 | P3, P4 | V1 | V2 |
|---|---|---|---|---|---|---|---|---|---|---|---|---|---|---|---|
| Stable Low | | | | | | | | | | | | | | | |
| 1 | Gnd | Vcsn1 | near Vdd | Gnd | Vdd | on | off | CS $I_{N1}$ | on | inactive | on | off | CS $I_{P2}$ | | |
| Transition (Low to High) | | | | | | | | | | | | | | | |
| 2 | Vdd | Vcsn1 + ΔV | | | | | | | | | | | | | |
| 3 | | | | | | | | weakly on | | | weakly on | | | | |
| 4 | | | near Gnd | | | | | | | | | | | | |
| 5 | | | | | | off | on | | | | | | | LH | |
| 6 | | Vcsp1 | | Vdd | | | | | | | | | | | HL |
| 7 | | | | | | | | | on | | | off | | | |
| 8 | | | | | Gnd | | | | | | | | | | |
| 9 | | | | | | | | | | off | CS $I_{N2}$ | CS $I_{P1}$ | on | inactive | |
| Stable High | | | | | | | | | | | | | | | |
| 10 | Vdd | Vscp1 | near Gnd | Vdd | Gnd | off | on | on | off | CS $I_{N2}$ | CS $I_{P1}$ | on | inactive | | |
| Transition (High to Low) | | | | | | | | | | | | | | | |
| 11 | Gnd | Vscp1 − ΔV | | | | | | | | | | | | | |
| 12 | | | | | | | | weakly on | | | weakly on | | | | |
| 13 | | | near Vdd | | | | | | | | | | | | |
| 14 | | | | | | on | off | | | | | | | HL | |
| 15 | | Vscn1 | | Gnd | | | | | | | | | | | |
| 16 | | | | | | | | off | | | on | | | LH | |
| 17 | | | | | Vdd | | | | | | | | | | |
| 18 | | | | | | | | CS $I_{N1}$ | on | inactive | | off | CS $I_{P2}$ | | |
| Stable Low | | | | | | | | | | | | | | | |
| 1 | Gnd | Vscn1 | near Vdd | Gnd | Vdd | on | off | CS $I_{N1}$ | on | inactive | on | off | CS $I_{P2}$ | | |

Table 2, "CS" means that the transistors act together as a current sink (for nmos transistors) or source (for pmos transistors), of the indicated current $I_{N1}$, $I_{N2}$, $I_{P1}$, or $I_{P2}$. "Weakly on" means that the voltage on "In" makes the transistor (N1 or P1) on, but not strongly. For instance in a 3.3 Volt digital process, voltages on "In" that are within the middle third of the power supply range (~1.1 to 2.2 Volts) could be considered to turn both the N1 and P1 transistors weakly on. "LH" means that the inverter (V1 or V2) is transitioning from a low to high output voltage. "HL" means that the inverter (V1 or V2) is transitioning from a high to low output voltage.

The Transition steps are broken up so that on a given row of the table either new node voltages, or new transistor and inverter driving states are introduced. It should be understood that the circuit does not strictly operate in this step to step fashion. For instance, transistors P1 and N1 regeneratively feedback to their inputs using transistors P11 and N11. Hence, transitions on the In and S nodes occur with a degree of simultaneity. However, the step sequence description in the table is useful for illustrating the basic operation of the circuit.

Transistor P4 and N4 in the refractory current sources are always held on. They are there to mimic the "on" switches P2 and N2 in the receptive current sources. This allows a more precise ratio of the refractory to receptive current to be achieved.

FIGS. 4A–4D show the generation circuits for the Vcsp1, Vcsp2, Vcsn1, and Vcsn2 signals. Note that Vcsp1 and Vcsp2 could be equal if the transistor sizes P3 and P4 were sized larger than transistor sizes P1 and P2 as needed to achieve the desired ratio of refractory to receptive currents. Likewise, that Vcsn1 and Vcsn2 could be equal if the transistor sizes N3 and N4 were sized larger than transistor sizes N1 and N2 as needed to achieve the desired ratio of refractory to receptive currents. The factors of M, K, R, and S indicate that the generation circuits can be scaled relative to the input buffer to provide the signals with a stronger drive strength.

Design Variations

A number of variations of the circuit illustrated in FIG. 3 are possible. For example, the ratio of the $I_{P2}$ refractory current to the $I_{P1}$ receptive current can be set by one or both of the following methods. In a first method, the ratio of transistors P3 and P4 to P1 and P2 can be changed. Larger P3 and P4 transistors increase the refractory current, whereas larger P1 and P2 transistors increase the receptive current. In a second method, Vcsp1 can be modified relative to Vcsp2. Lowering Vcsp2 relative to Vcsp1 increases the refractory current to receptive current ratio.

Similarly, the ratio of the $I_{N2}$ refractory current to the $I_{N1}$ receptive currents can be set by one or both of the following methods. In a first method, the ratio of transistors N3 and N4 to N1 and N2 can be changed. Larger N3 and N4 transistors increase the refractory current, whereas larger N1 and N2 transistors increase the receptive current. In a second method, Vcsn1 can be modified relative to Vcsn2. Raising Vcsn2 relative to Vcsn1 increases the refractory current to receptive current ratio.

The two refractory to receptive current ratios ($I_{P2}:I_{N1}$ and $I_{N2}:I_{P1}$) can be different. This makes rising and falling transitions have different speeds.

Transistors P11 and N11 can be weakened (by reducing the transistor width or increasing the transistor length).

Weakened transistors allow a slow input edge to be recognized because P11 and N11 will not drive the In node as strongly. However, weakened P11 and N11 transistors will also slow down the buffer's forward delay and recovery times, and will increase noise sensitivity.

The output delay chain (V1 and V2) can be changed. For instance V1 could include two or more inverters in order to provide for more amplification to the output node. V2 could include two or more inverters to provide additional delay before switching the T node. This provides additional time before the pull-up or pull-down pore is switched into the refractory state. The only condition is that the sum of the number of inverters in V1 and V2 must be even and greater than or equal to two.

Transistors P4 and N4 could be omitted if desired to reduce the total number of transistors in the circuit to save area. However, this would adversely affect the ability to set an exact ratio between the refractory and receptive currents.

Multiple inputs (D1, D2, . . . DN) connected by multiple capacitors (C1, C2, . . . CN) could be connected to node In. This would allow for the input buffer to also perform a temporal-based logic function on the D1 to DN signals. If a sufficient number of D* signals transitioned in the same direction in a short period of time, then the input buffer would transition. This implements the sum of products function and a threshold operation.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus for amplifying an input signal received from a capacitive sensor, comprising:
    an input that receives an input signal from the capacitive sensor;
    an amplifier that amplifies the input signal to produce an output signal;
    a pull-up circuit within the amplifier that pulls the output signal up to a high voltage when the input signal exceeds a threshold voltage;
    a pull-down circuit within the amplifier that pulls the output signal down to a low voltage when the input signal falls below the threshold voltage;
    wherein after the output signal is pulled up to the high voltage, the pull-up circuit enters a refractory state in which the pull-up circuit uses a limited current, and the pull-down circuit enters a receptive state in which the pull-down circuit is sensitized to react to small changes in the input signal;
    wherein after the output signal is pulled down to the low voltage, the pull-down circuit enters a refractory state in which the pull-down circuit uses a limited current, and the pull-up circuit enters a receptive state in which the pull-up circuit is sensitized to react to small changes in the input signal; and
    an output that makes output signal available to other circuitry.

2. The apparatus of claim 1, further comprising an output delay chain within the output that produces feedback;
    wherein after the output signal is pulled up to the high voltage, the feedback causes the pull-up circuit to enter the refractory state and causes the pull-down circuit to enter the receptive state; and
    wherein after the output signal is pulled down to the low voltage, the feedback causes the pull-down circuit to enter the refractory state and causes the pull-up circuit to enter the receptive state.

3. The apparatus of claim 1, further comprising a bi-stable circuit;
    wherein the bi-stable circuit is configured to hold the output to the high voltage until the input signal falls below the threshold voltage; and
    wherein the bi-stable circuit is configured to hold the output to the low voltage until the input signal rises above the threshold voltage.

4. The apparatus of claim 1, further comprising a pull-up current mirror with the pull-up circuit that is configured to limit the current used by the pull-up circuit in the refractory state.

5. The apparatus of claim 1, further comprising a pull-down current mirror with the pull-down circuit that is configured to limit the current used by the pull-down circuit in the refractory state.

6. The apparatus of claim 1, wherein when the pull-down circuit is in the receptive state and the input voltage drops below the threshold voltage, the pull-down circuit is configured to enter an active state in which the pull-down circuit draws sufficient current to rapidly switch the output signal to the low voltage.

7. The apparatus of claim 1, wherein when the pull-up circuit is in the receptive state and the input voltage rises above the threshold voltage, the pull-up circuit is configured to enter an active state in which the pull-up circuit draws sufficient current to rapidly switch the output signal to the high voltage.

8. The apparatus of claim 1, further comprising a high resting voltage circuit within the pull-up circuit that is configured to generate a high resting voltage for the input when the pull-up circuit is in the refractory state.

9. The apparatus of claim 1, further comprising a low resting voltage circuit within the pull-down circuit that is configured to generate a low resting voltage for the input when the pull-down circuit is in the refractory state.

10. The apparatus of claim 1, wherein the capacitive sensor is an I/O pad on a surface of a semiconductor chip.

11. An apparatus for amplifying an input signal received from a capacitive sensor, comprising:
    an input that receives an input signal from the capacitive sensor;
    an amplifier that amplifies the input signal to produce an output signal;
    a pull-up circuit within the amplifier that pulls the output signal up to a high voltage when the input signal exceeds a threshold voltage;
    a pull-down circuit within the amplifier that pulls the output signal down to a low voltage when the input signal falls below the threshold voltage;
    an output that makes output signal available to other circuitry;
    a bi-stable circuit that is configured to hold the output to the high voltage until the input signal falls below the threshold voltage, and is configured to hold the output to the low voltage until the input signal rises above the threshold voltage;
    wherein after the output signal is pulled up to the high voltage, the pull-up circuit enters a refractory state in which the pull-up circuit uses a limited current, and the pull-down circuit enters a receptive state in which the pull-down circuit is sensitized to react to small changes in the input signal;

wherein when the pull-down circuit is in the receptive state and the input voltage drops below the threshold voltage, the pull-down circuit is configured to enter an active state in which the pull-down circuit draws sufficient current to rapidly switch the output signal to the low voltage;

wherein after the output signal is pulled down to the low voltage, the pull-down circuit enters a refractory state in which the pull-down circuit uses a limited current, and the pull-up circuit enters a receptive state in which the pull-up circuit is sensitized to react to small changes in the input signal;

wherein when the pull-up circuit is in the receptive state and the input voltage rises above the threshold voltage, the pull-up circuit is configured to enter an active state in which the pull-up circuit draws sufficient current to rapidly switch the output signal to the high voltage.

12. A semiconductor chip that amplifies an input signal received from a capacitive sensor, comprising:

the capacitive sensor in the form of an I/O pad on a surface of the semiconductor chip that receives an input signal;

an amplifier that amplifies the input signal to produce an output signal;

a pull-up circuit within the amplifier that pulls the output signal up to a high voltage when the input signal exceeds a threshold voltage;

a pull-down circuit within the amplifier that pulls the output signal down to a low voltage when the input signal falls below the threshold voltage;

wherein after the output signal is pulled up to the high voltage, the pull-up circuit enters a refractory state in which the pull-up circuit uses a limited current, and the pull-down circuit enters a receptive state in which the pull-down circuit is sensitized to react to small changes in the input signal;

wherein after the output signal is pulled down to the low voltage, the pull-down circuit enters a refractory state in which the pull-down circuit uses a limited current, and the pull-up circuit enters a receptive state in which the pull-up circuit is sensitized to react to small changes in the input signal; and an output that makes output signal available to other circuitry on the semiconductor chip.

13. A method for amplifying an input signal received from a capacitive sensor, comprising:

receiving an input signal from the capacitive sensor; and amplifying the input signal to produce an output signal;

wherein when the input signal exceeds a threshold voltage, amplifying the input signal involves, using a pull-up circuit to pull the output signal up to a high voltage, causing the pull-up circuit to enter a refractory state in which the pull-up circuit uses a limited current, and causing a pull-down circuit enters a receptive state in which the pull-down circuit is sensitized to react to small changes in the input signal;

wherein when the input signal falls below the threshold voltage, amplifying the input signal involves, using the pull-down circuit to pull the output signal down to a low voltage, causing the pull-down circuit enters a refractory state in which the pull-down circuit uses a limited current, and causing the pull-up circuit to enter a receptive state in which the pull-up circuit is sensitized to react to small changes in the input signal.

14. The method of claim 13, further comprising using the output signal to generate feedback;

wherein after the output signal is pulled up to the high voltage, the feedback causes the pull-up circuit to enter the refractory state and causes the pull-down circuit to enter the receptive state; and wherein after the output signal is pulled down to the low voltage, the feedback causes the pull-down circuit to enter the refractory state and causes the pull-up circuit to enter the receptive state.

15. The method of claim 13, further comprising:

holding the output signal to the high voltage until the input signal falls below the threshold voltage; and holding the output signal to the low voltage until the input signal rises above the threshold voltage.

16. The method of claim 13, further comprising using a pull-up current mirror to limit the current used by the pull-up circuit in the refractory state.

17. The method of claim 13, further comprising using a pull-down current mirror to limit the current used by the pull-down circuit in the refractory state.

18. The method of claim 13, wherein when the pull-down circuit is in the receptive state and the input voltage drops below the threshold voltage, causing the pull-down circuit to enter an active state in which the pull-down circuit draws sufficient current to rapidly switch the output signal to the low voltage.

19. The method of claim 13, wherein when the pull-up circuit is in the receptive state and the input voltage rises above the threshold voltage, causing the pull-up circuit to enter an active state in which the pull-up circuit draws sufficient current to rapidly switch the output signal to the high voltage.

20. The method of claim 13, further comprising generating a high resting voltage for an input node when the pull-up circuit is in the refractory state.

21. The method of claim 13, further comprising generating a low resting voltage for an input node when the pull-down circuit is in the refractory state.

22. The method of claim 13, wherein the capacitive sensor is an I/O pad on a surface of a semiconductor chip.

* * * * *